United States Patent [19]

Markley

[11] 4,371,750
[45] Feb. 1, 1983

[54] MICROPHONE AND REMOTE CONTROL SYSTEM

[76] Inventor: John B. Markley, 2503 Valley Ave., Marion, Ind. 46952

[21] Appl. No.: 171,741

[22] Filed: Jul. 24, 1980

[51] Int. Cl.$^3$ ............................................. G11B 19/16
[52] U.S. Cl. ............................... 179/1 VL; 179/179; 369/25
[58] Field of Search ............... 179/1 VL, 1 SW, 178, 179/179; 455/77, 78, 89, 90, 95, 99, 128, 345, 351; 369/25

[56] References Cited

U.S. PATENT DOCUMENTS

| | | | |
|---|---|---|---|
| 3,258,544 | 6/1966 | DeHaan | 179/179 |
| 3,555,202 | 1/1971 | Warnke | 369/25 |
| 3,636,271 | 1/1972 | Rodenbeck | 369/25 |
| 4,032,844 | 6/1977 | Imazeki | 179/179 X |

FOREIGN PATENT DOCUMENTS 1177840  9/1964  Fed. Rep. of Germany ........ 369/25

*Primary Examiner*—Joseph A. Popek
*Attorney, Agent, or Firm*—Gust, Irish, Jeffers & Hoffman

[57] ABSTRACT

A microphone and remote control system includes a microphone assembly having a microphone, at least two manually adjustable gain control devices, at least two switches, and a housing enclosing the gain control devices and switches and having the microphone mounted thereon. One gain control device is coupled to the microphone for selectively adjusting the output level thereof. A connector assembly includes a first connector coupled to the one gain control device with a mating connector adapted to be coupled to the input of an audio output system. A second connector is coupled to the other gain control device and a mating connector is adapted to be coupled to the output circuit of audio reproduction apparatus, such as a tape deck. A third connector is coupled to the other gain control device and a mating connector is adapted to be coupled to the audio output system. The audio reproduction apparatus includes "start" and "stop" input circuits for controlling the start and stop functions thereof. A fourth connector is coupled to the two switches and a mating connector is adapted to be coupled to the input circuits of the audio reproduction apparatus. The connectors are respectively coupled to the gain control devices and the switches by a multi-conductor, flexible cable.

8 Claims, 2 Drawing Figures

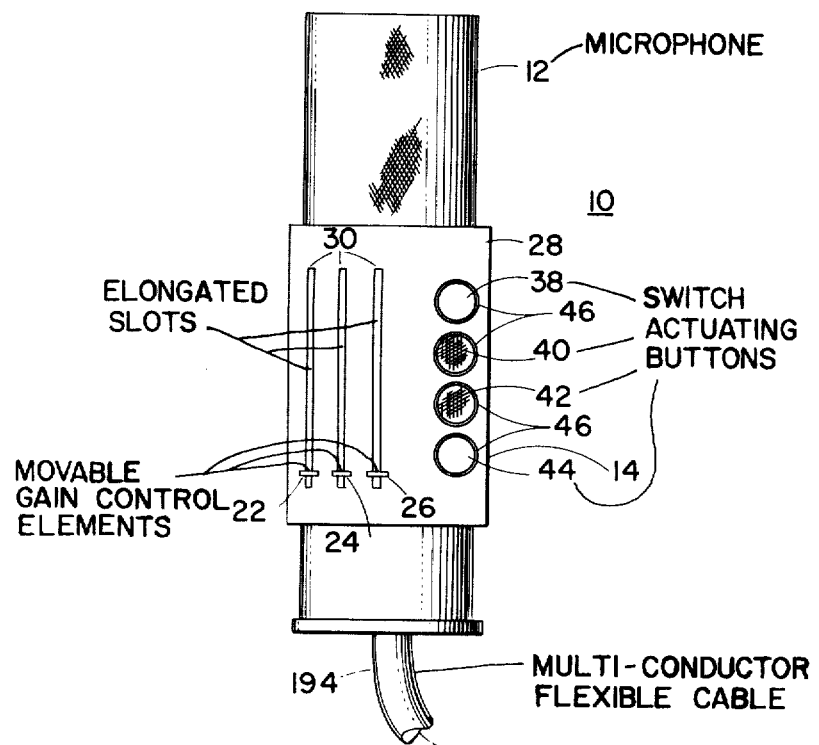
*Fig. 1*
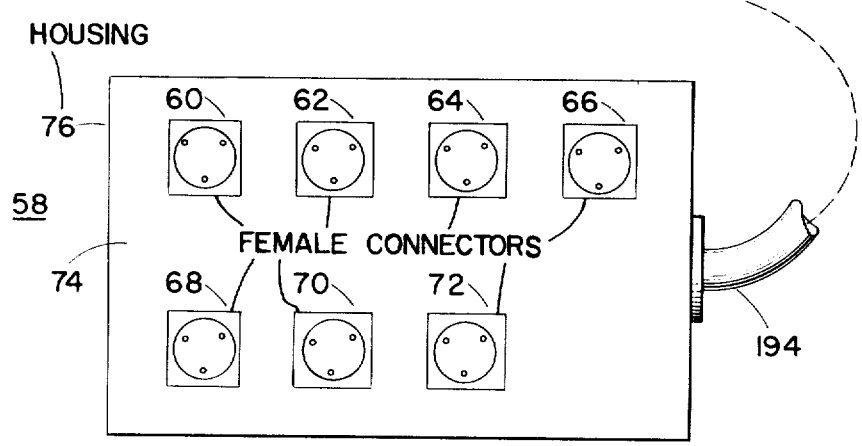

4,371,750

MICROPHONE AND REMOTE CONTROL SYSTEM

BACKGROUND OF THE INVENTION

1. Field of the Invention

This invention relates generally to sound systems, and more particularly to a hand-held microphone and remote control system by which the level of the output signal from the microphone and the functions of other electrical apparatus, such as sound reproduction apparatus, may be controlled.

2. Description of the Prior Art

Certain solo entertainers and artists, such as singers and instrumentalists, use a sound system including a microphone, and also employ audio reproduction equipment, such as a tape recorder, in their performance to provide background music, accompaniment, or the like. It is desirable to control the level of the microphone output, and also the level and the start/stop control function of the audio reproduction equipment. In the past, it has been common practice to provide a control console or rack within reach of the performer, which often is an unsightly distraction, or it was necessary to incur the additional expense of an audio technician, the only alternative being to provide an initial level setting which was left unchanged during the entire program.

It is therefore desirable to provide a hand-held microphone and remote control system with which the performer can adjust the levels of both the microphone and the audio recording equipment, and also control the start/stop function of the audio recording equipment, lighting, projection equipment, etc.

SUMMARY OF THE INVENTION

The invention, in its broader aspects, provides a microphone and remote control system comprising a microphone assembly adapted to be hand-held and including a microphone, at least one manually adjustable gain control device, and at least one switch, the gain control device being coupled to the microphone for selectively adjusting the output level thereof. A connector assembly is provided including a first connector coupled to the gain control device and adapted to be connected to an audio output system for supplying the output of the microphone thereto. A second connector is provided coupled to the switch and adapted to be coupled to other electrical apparatus for controlling a function thereof in response to actuation of the switch.

An object of the invention is to provide a hand-held microphone and remote control system by which the output level of the microphone and a function of other electrical apparatus can be controlled.

Another object of the invention is provide a hand-held microphone and remote control system by which the output levels of the microphone and audio recording apparatus can be controlled, and the start/stop functions of the audio recording apparatus can also be controlled.

The above-mentioned and other features and objects of this invention and the manner of attaining them will become more apparent and the invention itself will be best understood by reference to the following description of an embodiment of the invention taken in conjunction with the accompanying drawings.

BRIEF DESCRIPTION OF THE DRAWINGS

FIG. 1 is a side view showing the hand-held microphone and remote control assembly of the invention.

DESCRIPTION OF THE PREFERRED EMBODIMENT

Figure 2:
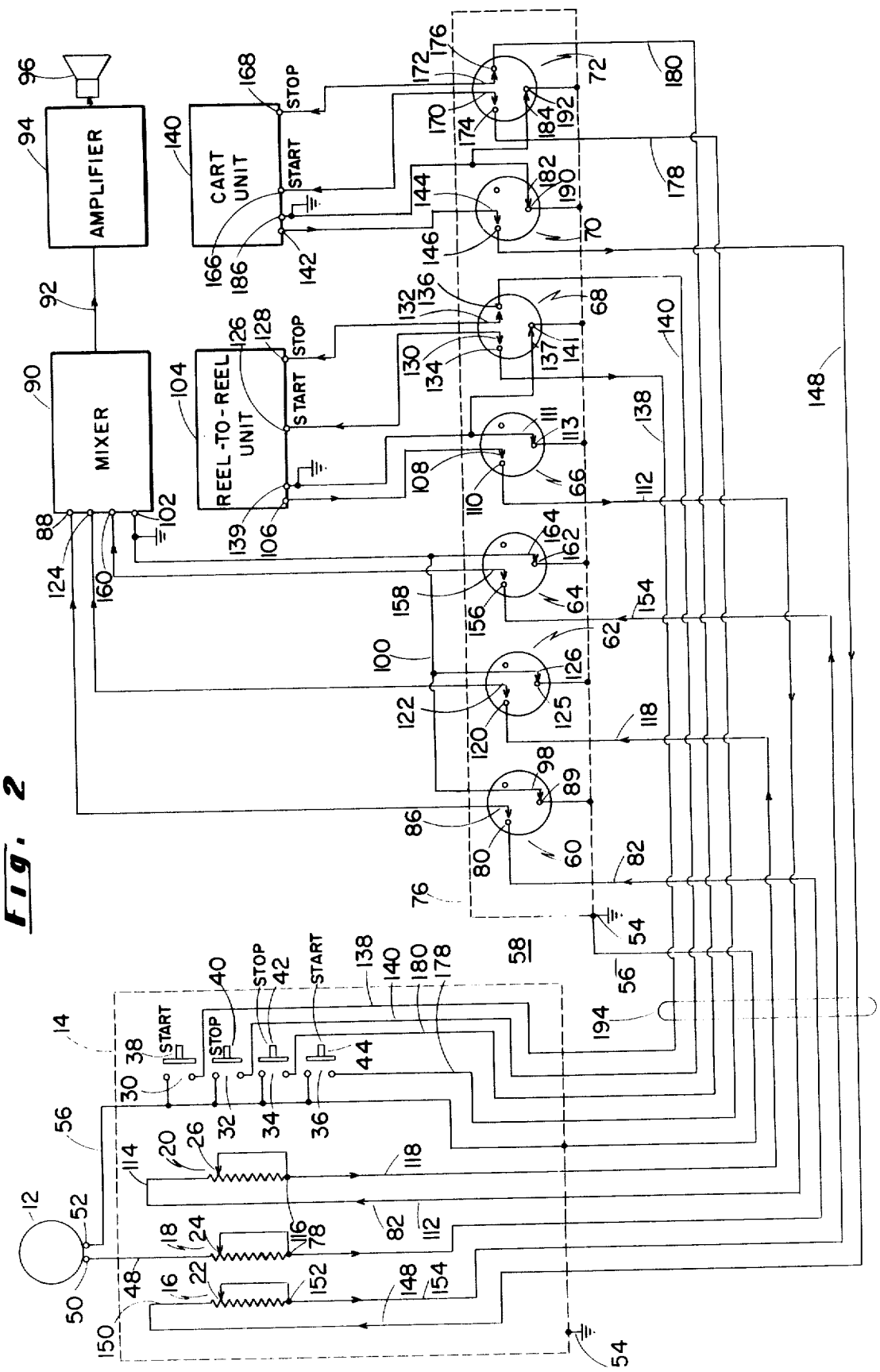
FIG. 2 is a schematic diagram showing the hand-held microphone and remote control assembly of FIG. 1.

Referring now to the drawings, a microphone assembly is provided, generally indicated at 10, which includes a conventional low-impedance microphone 12 mounted on housing 14, housing 14 and microphone 12 adapted to be hand-held.

Three manually adjustable gain control devices 16, 18 and 20 are provided. In the illustrated embodiment, gain control devices 16, 18 and 20 comprise linear potentiometers having manually adjustable, linearly movable control elements 22, 24, 26. Gain control devices 16, 18, 20 are mounted in housing 14 which has wall 28 with elongated slots 30 formed therein through which control elements 22, 24, 26 extend (FIG. 1).

Four switches 30, 32, 34, 36 are mounted in housing 14 and have actuating buttons 38, 40, 42 and 44 respectively extending through holes 46 in wall 28. In the illustrated embodiment, switches 30, 38 and 36, 44 are "start" switches, and switches 32, 40 and 34, 42 are "stop" switches.

End 48 of gain control device 18 is connected to one terminal 50 of microphone 12, the other terminal 52 being connected to ground 54 by electrical lead 56 to which one terminal of each of the switches 30, 32, 34 and 36 is also connected, as shown.

Connector assembly 58 comprises conventional female connectors 60, 62, 64, 66, 68, 70 and 72 mounted on wall 74 of housing 76. End 78 of gain control device 18 is connected to terminal 80 of connector 60 by electrical lead 82, and terminal 89 is connected to ground 54, as shown. Contact 86 of a male connector cooperating with female connector 60 is coupled to input terminal 88 of one channel of conventional mixer 90 which has it output 92 coupled to the input of audio amplifier 94; amplifier 94 is coupled to loudspeaker 96. The microphone 12, its circuit, amplifier 94 and speaker 96 constitute a public address system.

Ground lead 56 is connected to housing 76 of connector assembly 58. Contact 98 of the male connector cooperating with female connector 60 is coupled by electrical lead 100 to ground terminal 102 of mixer 90. It will now be seen that the output level of microphone 12 is selectively adjusted by gain control device 18, and that the adjusted microphone output is adapted to be coupled by connector 60 to one input channel of mixer 90.

audio reproduction equipment, such as reel-to-reel tape machine 104 has its audio output terminal 106 coupled to contact 108 of the male connector cooperating with female connector 66. Terminal 110 of female connector 66 is coupled by electrical lead 112 to end 114 of gain control device 20. The other end 116 of gain control device 20 is coupled by electrical lead 118 to terminal 120 of female connector 62. Contact 122 of the male connector cooperating with female connector 62 is coupled to input terminal 124 of a second channel of mixer 90. Contact 126 of the male connector cooperating with female connector 62 is coupled to ground lead 100 and cooperating terminal 125 of female connector 62 is connected to housing 56 and thus to ground 54, as shown. It will thus be seen that the output level of reel-to-reel unit 104 may be selectively adjusted by gain control device 20 and that the adjusted output level of reel-to-reel unit 104 is applied to another input channel of mixer 90.

Reel-to-reel unit 104 may be provided with conventional solenoid-operated "start" and "stop" function circuitry having start input terminal 126 and stop input terminal 128. Start and stop input terminals 126, 128 of reel-to-reel unit 104 are coupled to contacts 130, 132 of the male connector cooperating with female connector 68. Terminals 134, 136 of female connector 68 are respectively coupled to "start" and "stop" switches 30, 32 by electrical leads 138, 140. Contacts 111 and 137 of the male connectors cooperating with female connectors 66, 68 are connected to ground terminal 139 of reel-to-reel unit 104, and terminals 113, 141 of female connectors 66, 68 are connected to housing 56 and thence to ground 54. It will now be seen that actuation of "start" switch 30, 38 or "stop" switch 32, 40, respectively, will initiate the "start" or "stop" function of reel-to-reel recording unit 104.

Another audio recording apparatus, such as a cart machine 140 has its audio output terminal 142 coupled to contact 144 of the male connector cooperating with female connector 70. Terminal 146 of female connector 70 is coupled by electrical lead 148 to end 150 of gain control device 16. The other end 152 of gain control device 16 is coupled by electrical lead 154 to terminal 156 of female connector 64. Contact 158 of the male connector cooperating with female connector 64 is coupled to terminal 160 of another input channel of mixer 90. Terminal 162 of female connector 64 is coupled to housing 56 and thus to ground 54 and contact 164 of a male connector cooperating with female connector 64 is coupled to ground lead 100. It will now be seen that the level of the output signal from cart unit 140 is controlled by gain control device 16 and the output signal so controlled is applied to mixer 90. Cart unit 140 also has conventional solenoid-controlled "start" and "stop" function having "start" and "stop" input terminals 166, 168. "Start" and "stop" input terminals 166, 168 of cart unit 140 are coupled respectively to contacts 170, 172 of the male connector cooperating with the female connector 72. Terminals 174, 176 of female connector 72 are respectively coupled to "start" and "stop" switches 36, 34 by electrical leads 178, 180. Contacts 182, 184 of the male connectors respectively cooperating with female connectors 70, 72 are respectively coupled to ground terminal 186 of cart unit 140, and terminals 190, 192 of female connectors 70, 72 are respectively connected to housing 56 and thence to ground 54. It will now be seen that actuation of "start" switch 36, 44 or "stop" switch 34, 42 will actuate the "start" or "stop" function, respectively, of cart unit 140.

Electrical leads 82, 112, 118, 140, 148, 154, 178 and 180, along with ground lead 56 are included in elongated, multi-conductor flexible cable 194 extending between microphone assembly 10 and connector assembly 58.

It will be readily understood that multi-conductor connectors may be employed to connect the opposite ends of cable 194 to microphone assembly 10 and connector assembly 58, respectively. It will also be readily seen that one or more of the switches 30–36, or additional switches, may be employed for controlling a "start"/"stop" or "on"/"off" function of some other electrical apparatus, such as lighting or projection equipment. It will also be readily understood that housing 14 of microphone assembly 10 along with the casing for microphone 12 may be integrally molded of suitable plastic material, and that it may be so molded as to fit the contour of the hand. It will further be understood that the female connectors referred to may be male-type and vice versa.

It will now be seen that the invention provides a hand-held microphone and remote control assembly by which a performer can control not only the output level of his own microphone, but also the output level of audio recording apparatus and the "start"/"stop" or "on"/"off" functions of such recording apparatus or other electrical apparatus, such as lighting or projection equipment.

While there have been described above the principles of this invention in connection with specific apparatus, it is to be clearly understood that this description is made only by way of example and not as a limitation to the scope of the invention.

What is claimed is:

1. An electrical control apparatus comprising a public address system having a microphone circuit, an amplifier and a speaker for audibly reproducing signals from said amplifier; a first gain control coupled between the microphone circuit and amplifier for controlling the amplitude of microphone signals from said microphone circuit; audio reproduction apparatus selectively connected to said amplifier for generating signals reproducible by said amplifier and speaker concurrently with said microphone signals; a first control function means for controlling the operation of said audio reproduction apparatus; said first control function means including a first switch and a second gain control; a hand-held accessory unit carrying said first gain control and said first control function means, said unit being remotely located with respect to said amplifier, speaker and audio reproduction apparatus; a connecting accessory also remotely located and carrying one or more electrical connecting devices each composed of male and female connectors, said connectors each including conductive contacts, said first gain control and said first control function means including first electrical leads connected between said hand-held unit and predetermined ones of said connecting devices whereby the microphone circuit and said audio reproduction apparatus may be controlled in reproducing audio signals from both concurrently, said connecting devices further being connected between
 (a) said first gain control and said amplifier, speaker and audio reproduction apparatus,
 (b) between said first control function means and said amplifier, speaker, and audio reproduction apparatus, and between
 (c) said audio reproduction apparatus and said amplifier.

2. The apparatus of claim 1 wherein said microphone circuit comprises a microphone on said hand-held unit.

3. The apparatus of claim 2 wherein said first gain control and said first control function means include second electrical leads connected between said connecting accessory and said audio reproduction apparatus, said amplifier and speaker.

4. The apparatus of claim 3 wherein said first electrical leads are in the form of multi-conductor flexible cable.

5. The apparatus of claim 4 wherein said hand-held unit includes a housing enclosing said first ans second gain controls and said switch, said microphone bein on said housing, and said gain controls and switch being manually operable.

6. The system of claim 5 wherein said gain controls are linear variable resistance devices respectively having linearly movable control elements, said housing having a wall with elongated slots formed therein, said control elements respectively extending outwardly through said slots, said switch having an actuating element extending through an opening in said wall.

7. The apparatus of claim 1 wherein there are at least two switches like said one switch, said audio reproduction apparatus having "start" and "stop" function input circuits, said two switches having electrical leads connected via connecting devices within said connecting accessory to said "start" and "stop" circuits for controlling the "start" and "stop" functions of said audio reproduction apparatus.

8. The apparatus of claim 7 wherein there are four of said connecting devices, one interconnecting said microphone circuit and first gain control with said amplifier and speaker, a second interconnecting one side of said second gain control with said amplifier and speaker, a third interconnecting the other side of said second gain control with an output circuit of said audio reproduction apparatus, and the fourth interconnecting said two switches, respectively, with said "start" and "stop" circuits.

* * * * *